(12) United States Patent
Dennard et al.

(10) Patent No.: US 8,754,672 B2
(45) Date of Patent: Jun. 17, 2014

(54) VOLTAGE CONVERSION AND INTEGRATED CIRCUITS WITH STACKED VOLTAGE DOMAINS

(75) Inventors: Robert H. Dennard, Croton-on-Hudson, NY (US); Brian L. Ji, Fishkill, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/420,080

(22) Filed: Mar. 14, 2012

(65) Prior Publication Data

US 2012/0169319 A1 Jul. 5, 2012

Related U.S. Application Data

(63) Continuation of application No. 12/422,391, filed on Apr. 13, 2009, now Pat. No. 8,174,288.

(51) Int. Cl.
*H03K 19/0175* (2006.01)
(52) U.S. Cl.
USPC .............. 326/81; 326/83; 326/101; 326/121; 326/63; 327/333; 327/530
(58) Field of Classification Search
USPC ............. 326/62–65, 81–83, 86–87, 112, 115, 326/121; 327/108–109, 333; 330/277, 330/290–295
See application file for complete search history.

(56) References Cited

U.S. PATENT DOCUMENTS

| | | |
|---|---|---|
| 4,752,699 A | 6/1988 | Cranford, Jr. et al. |
| 5,270,581 A | 12/1993 | Nakamura |

(Continued)

FOREIGN PATENT DOCUMENTS

| | | |
|---|---|---|
| CN | 1937378 A | 3/2007 |
| CN | 101320729 A | 12/2008 |
| JP | 60239117 A | 11/1985 |
| WO | 2007054858 A2 | 5/2007 |

OTHER PUBLICATIONS

Charge Pumps: An Overview, [online]; [retrieved on Jan. 29, 2009]; retrieved from the Internet http://www.eceg.utoronto.ca/~kphang/ece1371/chargepumps.pdf Louie Pylarinos, "Charge Pumps: An Overview," pp. 1-7; Proceedings of the IEEE International Symposium on Circuits and Systems; 2003.

(Continued)

*Primary Examiner* — Alexander H Taningco
*Assistant Examiner* — Christopher Lo
(74) *Attorney, Agent, or Firm* — Cantor Colburn LLP; Vazken Alexanian

(57) ABSTRACT

A reversible, switched capacitor voltage conversion apparatus includes a plurality of individual unit cells coupled to one another in stages, with each unit cell comprising multiple sets of inverter devices arranged in a stacked configuration, such that each set of inverter devices operates in separate voltage domains wherein outputs of inverter devices in adjacent voltage domains are capacitively coupled to one another such that a first terminal of a capacitor is coupled to an output of a first inverter device in a first voltage domain, and a second terminal of the capacitor is coupled to an output of a second inverter in a second voltage domain; and wherein, for both the first and second voltage domains, outputs of at least one of the plurality of individual unit cells serve as corresponding inputs for at least another one of the plurality of individual unit cells.

6 Claims, 22 Drawing Sheets

(56) References Cited

U.S. PATENT DOCUMENTS

| | | |
|---|---|---|
| 5,581,506 A | 12/1996 | Yamauchi |
| 5,631,816 A | 5/1997 | Brakus |
| 5,867,040 A * | 2/1999 | Fuse et al. ................. 326/101 |
| 5,897,040 A | 4/1999 | Ward |
| 6,075,401 A | 6/2000 | Inoue et al. |
| 6,147,540 A | 11/2000 | Coddington |
| 6,204,141 B1 | 3/2001 | Lou |
| 6,304,068 B1 | 10/2001 | Hui et al. |
| 6,600,220 B2 | 7/2003 | Barber et al. |
| 6,600,679 B2 | 7/2003 | Tanzawa et al. |
| 6,617,903 B2 | 9/2003 | Kawamura |
| 6,646,425 B2 | 11/2003 | Miftakhutdinov |
| 6,657,420 B1 | 12/2003 | Shacter |
| 6,744,297 B2 | 6/2004 | Huang |
| 6,838,927 B2 | 1/2005 | Oonishi |
| 7,051,306 B2 | 5/2006 | Hoberman et al. |
| 7,095,619 B2 | 8/2006 | Panella et al. |
| 7,116,594 B2 | 10/2006 | Luk et al. |
| 7,129,751 B2 | 10/2006 | Jahan et al. |
| 7,190,210 B2 | 3/2007 | Azrai et al. |
| 7,230,455 B2 | 6/2007 | Luk |
| 7,257,723 B2 | 8/2007 | Galles |
| 7,315,463 B2 | 1/2008 | Schrom et al. |
| 7,342,389 B1 | 3/2008 | Wu et al. |
| 7,348,800 B2 | 3/2008 | Koto et al. |
| 7,358,573 B2 | 4/2008 | Cecchi et al. |
| 7,518,481 B2 | 4/2009 | Gardner et al. |
| 7,551,018 B2 | 6/2009 | Hsu et al. |
| 7,564,263 B2 | 7/2009 | Walker et al. |
| 7,581,198 B2 | 8/2009 | Huynh et al. |
| 7,609,114 B2 | 10/2009 | Hsieh et al. |
| 7,750,717 B2 | 7/2010 | Ali et al. |
| 7,768,309 B2 | 8/2010 | Luich |
| 2002/0024374 A1 | 2/2002 | Ovens et al. |
| 2003/0155897 A1 | 8/2003 | Miftakhutdinov |
| 2005/0140426 A1 | 6/2005 | Fujiwara |
| 2005/0145895 A1 | 7/2005 | Luk et al. |
| 2005/0213267 A1 | 9/2005 | Azrai et al. |
| 2005/0213280 A1 | 9/2005 | Azrai et al. |
| 2006/0071650 A1 | 4/2006 | Narendra et al. |
| 2006/0099734 A1 | 5/2006 | Narendra et al. |
| 2006/0139086 A1 * | 6/2006 | Heinz et al. ................. 327/333 |
| 2008/0079461 A1 | 4/2008 | Lin et al. |
| 2008/0080111 A1 | 4/2008 | Lin et al. |
| 2008/0080112 A1 | 4/2008 | Lin et al. |
| 2008/0080113 A1 | 4/2008 | Lin et al. |
| 2008/0081457 A1 | 4/2008 | Lin et al. |
| 2008/0081458 A1 | 4/2008 | Lin et al. |
| 2008/0111242 A1 | 5/2008 | Lin et al. |
| 2008/0162770 A1 | 7/2008 | Titiano et al. |
| 2008/0239772 A1 * | 10/2008 | Oraw et al. ................. 363/60 |
| 2009/0033155 A1 | 2/2009 | Kanno et al. |
| 2009/0059653 A1 | 3/2009 | Luk et al. |
| 2009/0103382 A1 | 4/2009 | Luk et al. |
| 2009/0261793 A1 * | 10/2009 | Urakabe et al. ................. 323/282 |
| 2009/0289291 A1 | 11/2009 | Cheng et al. |
| 2010/0033224 A1 | 2/2010 | Acharya |
| 2010/0214014 A1 | 8/2010 | Dennard et al. |
| 2010/0237941 A1 * | 9/2010 | Goldfarb et al. ................. 330/253 |
| 2011/0018919 A1 | 1/2011 | Oshima et al. |

OTHER PUBLICATIONS

Cockcroft-Walton generator, [online]; [retrieved on Jan. 29, 2009]; retrieved from the Internet http://www.en.wikipedia.org/wiki/Cockcroft-Walton_generator.

D. Maurath et al; "A self-adaptive switched-capacitor voltage converter with dynamic input load control for energy harvesting;" Proc. ESSCIRC; Sep. 14-18, 2009; pp. 284-287.

D. Stepanovic et al.; "Gated-diode Sense Amplifier for Robust Differential sensing in 6T SRAM;" Univ. of California, Berkeley; published on-line; May 3, 2007.

F H Khan et al., "A 5 kW Bi-directional Multilevel Modular DC-DC Converter (MMCCC) Featuring Built in Power Management for Fuel Cell and Hybrid Electric Automobiles," Vehicle Power and Propulsion Conference; Sep. 9, 2007, pp. 208-214, IEEE.

Gerhard Schrom, et al., "Feasibility of Monolithic and 3D-Stacked DC-DC Converters for Microprocessors in 90nm Technology Generation," Copyright 2004 ACM, 6 pages.

International Search Report; International Application No. PCT/EP2010/051288; International Filing Date: Feb. 3, 2010; Date of mailing: Jun. 21, 2010; 5 pages.

International Search Report; International Application No. PCT/US/10/26748; International Filing Date: Mar. 10, 2010; Date of mailing: May 3, 2010; 7 pages.

J. Kwong et al.; "A 65 nm Sub-V Sub-t Microcontroller With Integrated SRAM and Switched Capacitor DC-DC Converter;" IEEE Journal of Solid-State Circuits, vol. 44, 1 , Jan. 2009; pp. 115-126.

U.S. Appl. No. 12/422,391; Notice of Allowance; Date Filed: Apr. 13, 2009; Date Mailed: Jan. 9, 2012.

U.S. Appl. No. 12/392,476; Final Office Action; Date Filed: Feb. 25, 2009; Date Mailed: Feb. 9, 2012; pp. 1-9.

U.S. Appl. No. 12/392476; Non-Final Office Action; Date Filed: Feb. 25, 2009; Date Mailed Oct. 25, 2011.

U.S. Appl. No. 12/623,462; Non-Final Office Action; Date Filed: Nov. 23, 2009; Date Mailed: Feb. 6, 2012; pp. 1-26.

U.S. Appl. No. 12/422,391; Final Office Action; Date Filed: Apr. 13, 2009; Date Mailed: Sep. 7, 2011.

W. K. Luk et al.; "Gated-Diode Amplifiers;" IEEE Transaction on Circuits and Systems—II: Express Briefs, vol. 52, No. 5; May 2005, pp. 266-270.

Written Opinion of the International Searching Authority; International Application No. PCT/EP2010/051288; International Filing Date: Feb. 3, 2010; Date of mailing: Jun. 21, 2010; 5 pages.

Written Opinion; International Application No. PCT/US/10/26748; International Filing Date: Mar. 10, 2010; Date of mailing: May 3, 2010; 5 pages.

U.S. Appl. No. 13/552,091; Non-Final Office Action; Filing Date: Jul. 18, 2012; Date of Mailing: Oct. 25, 2012; pp. 1-16.

\* cited by examiner

| | R2 (Ohm) | R1 (Ohm) | V2 (V) | V1 (V) | Vdd2 = V2 - V1 | Vdd1 = V1 | I2 (A) | I1 (A) | P2 (W) | P1 (W) |
|---|---|---|---|---|---|---|---|---|---|---|
| w/o regulator | 0.8 | 1 | 1.8 | 1 | 0.8 | 1 | 1 | 1 | 0.8 | 1 |
| with regulator | 0.8 | 1 | 1.8 | 0.95 | 0.85 | 0.95 | 1.0625 | 0.95 | 0.903 | 0.903 |

Fig. 5

| | R2 (Ohm) | R1 (Ohm) | V2 (V) | V1 (V) | Vdd2 = V2 - V1 | Vdd1 = V1 | I2 (A) | I1 (A) | P2 (W) | P1 (W) |
|---|---|---|---|---|---|---|---|---|---|---|
| w/o regulator | 1 | 0.8 | 1.8 | 0.8 | 1 | 0.8 | 1 | 1 | 1 | 0.8 |
| with regulator | 1 | 0.8 | 1.8 | 0.85 | 0.95 | 0.85 | 0.95 | 1.0625 | 0.903 | 0.903 |

Fig. 6

VOLTAGE CONVERSION AND INTEGRATED CIRCUITS WITH STACKED VOLTAGE DOMAINS

CROSS-REFERENCE TO RELATED APPLICATION

This application is a continuation of U.S. patent application Ser. No. 12/422,391, filed Apr. 13, 2009, the disclosure of which is incorporated by reference herein in its entirety.

BACKGROUND

The present invention relates generally to voltage conversion techniques and, more particularly, to a reversible voltage conversion system and an integrated circuit (IC) system having stacked voltage domains, voltage level shifting and voltage stabilization.

Power management has become a critical component for advanced computing architectures, including both high-end microprocessor systems and mobile electronic devices. However, existing on-chip solutions have limited success in simultaneously achieving high output current and high power conversion efficiency.

In particular, nominal power supply voltage ($V_{DD}$) values for CMOS (complementary metal oxide semiconductor) technology have been gradually reduced over the past years due to performance and power scaling. In turn, maintaining efficiency in power delivery systems has become more difficult as $V_{DD}$ is scaled down. At $V_{DD}$=1 Volt (V), the energy loss from an external power source to the circuits operated at $V_{DD}$ is significant. Since the power loss on the delivery grid is inversely proportional to the square of the voltage ($V^2$), the efficiency issue on power delivery is further exacerbated for so-called "low" $V_{DD}$ circuits (e.g., about 300-500 millivolts (mV)).

Accordingly, it would be desirable to be able to provide improved voltage conversion systems for integrated circuit devices and improved total system power management.

SUMMARY

In an exemplary embodiment, a reversible, switched capacitor voltage conversion apparatus includes a plurality of individual unit cells coupled to one another in stages, with each unit cell comprising multiple sets of inverter devices arranged in a stacked configuration, such that each set of inverter devices operates in separate voltage domains wherein outputs of inverter devices in adjacent voltage domains are capacitively coupled to one another such that a first terminal of a capacitor is coupled to an output of a first inverter device in a first voltage domain, and a second terminal of the capacitor is coupled to an output of a second inverter in a second voltage domain; and wherein, for both the first and second voltage domains, outputs of at least one of the plurality of individual unit cells serve as corresponding inputs for at least another one of the plurality of individual unit cells.

BRIEF DESCRIPTION OF THE SEVERAL VIEWS OF THE DRAWINGS

Referring to the exemplary drawings wherein like elements are numbered alike in the several Figures:

FIG. 5 is a table that illustrates an example of implementing constant power operation with respect to the first and second integrated circuits IC-1 and IC-2 of FIG. 4;

FIG. 6 is a table that illustrates another example of implementing constant power operation with respect to the first and second integrated circuits IC-1 and IC-2 of FIG. 4;

DETAILED DESCRIPTION

Disclosed herein is an integrated circuit (IC) system having stacked voltage domains, voltage level shifting and voltage stabilization. Briefly stated, exemplary embodiments of the disclosed system include multiple ICs that are operated in divided and serially stacked voltage domains, wherein each domain has a voltage drop thereacross approximately equal to a nominal power supply voltage value ($V_{dd}$). For example, a first integrated circuit operates within a voltage domain between ground and $V_{dd}$, a second integrated circuit operates within a voltage domain between $V_{dd}$ and about $2*V_{dd}$, and a third integrated circuit operates within a voltage domain between about $2*V_{dd}$ and about $3*V_{dd}$. Additional stacked ICs are also contemplated, however.

Although most of the power of the disclosed system can be passed down through the ICs directly, a reversible switched capacitor voltage conversion system is used to stabilize the divided voltage domain, as described in further detail below. In addition to reversible voltage converters (in that voltage nodes in the domains can represent either input voltages or output voltages), the system also features high-speed voltage level shifters used for data communication between ICs operating in different voltage domains.

Further, embodiments of the reversible switched capacitor voltage converter include ICs operated in divided and serially stacked voltage domains, except for the switched capacitors. One terminal of the switched capacitor is in one voltage domain while the other terminal of the switched capacitor is in another voltage domain.

Figure 1:
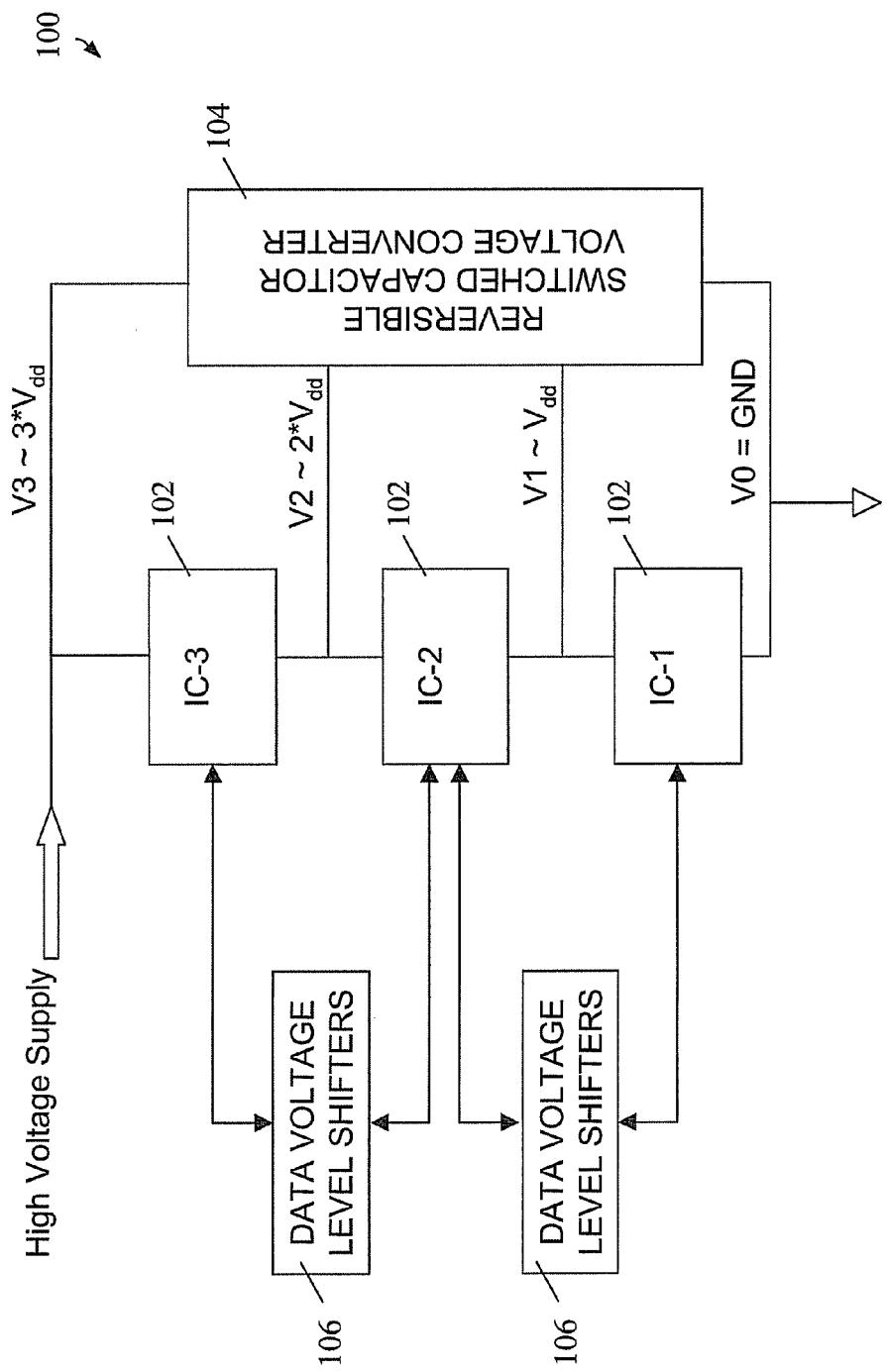
FIG. 1 is a schematic diagram of an integrated circuit (IC) system having stacked voltage domains, voltage level shifting and voltage stabilization, in accordance with an embodiment of the invention.

Referring initially to FIG. 1, there is shown a schematic diagram of an integrated circuit (IC) system 100 having stacked voltage domains, voltage level shifting and voltage stabilization, in accordance with an embodiment of the invention. In particular, the system 100 includes a plurality of integrated circuits 102 (individually designated in FIG. 1 as IC-1, IC-2, and IC-3) configured in a stacked arrangement with respect to a power supply configuration, in that the high side supply rail for IC-1 is common with the low side supply rail for IC-2, and the high side supply rail for IC-2 is common with the low side supply rail for IC-3. However, each of the ICs 102 individually operates with about the same voltage value ($V_{dd}$) across their respective power rails. In the example depicted, three voltage domains are illustrated (namely, V1 to V0, V2 to V1, and V3 to V2, where V0=0, V1~$V_{dd}$, V2~2*$V_{dd}$, and V3~3*$V_{dd}$) although it will be appreciated that even more voltage domains and integrated circuits could also be configured within the system. As indicated above, a reversible voltage converter 104 stabilizes the voltage domains of the system 100. Electrical current can flow in both directions in each of the four voltage nodes (V0, V1, V2, and V3) of the reversible voltage converter. One exemplary embodiment of the reversible voltage converter 104 is a multi-node switched capacitor voltage converter, while another exemplary embodiment of the reversible voltage converter 104 can be one or more synchronous buck converters.

In a practical system implementation, it is desirable for data to be communicated between the various ICs 102. Given the different voltage domains that exist from IC to IC, data voltage level shifters 106 are also included within the system 100 so that, for example, logical data from IC-1 in the V1 to ground voltage domain may be interpreted by IC-2 in the V2 to V1 voltage domain, and vice versa. Similarly, logical data from IC-2 in the V2 to V1 voltage domain may be interpreted by IC-3 in the V3 to V2 voltage domain, and vice versa.

Figure 2:
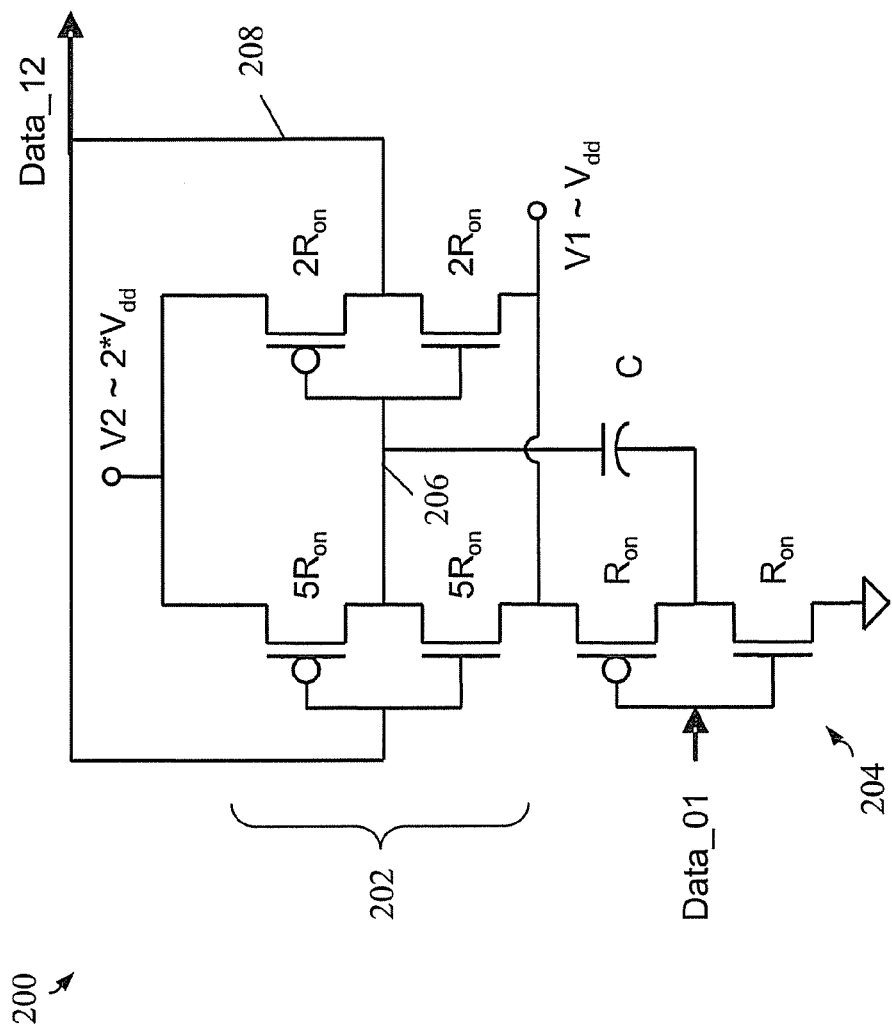
FIG. 2 is a schematic diagram of an exemplary voltage level shifter circuit that may be included within the data voltage level shifters of FIG. 1, in accordance with a further embodiment of the invention.

FIG. 2 is a schematic diagram of an exemplary voltage level shifter circuit 200 that may be included within the data voltage level shifters 106 of FIG. 1, in accordance with a further embodiment of the invention. In the example depicted, the circuit 200 converts a data transition from a lower voltage domain to a higher voltage domain. Even more specifically, circuit 200 converts input data from the first voltage domain (V1 to ground) to output data for use in the second voltage domain (V2 to V1). If, for example, $V_{dd}$=1.0 V, then the following values apply: logical "0" in the first voltage domain corresponds to 0 V, logical "1" in the first voltage domain corresponds to 1.0 V, logical "0" in the second voltage domain corresponds to 1.0 V, and logical "1" in the second voltage domain corresponds to 2.0 V.

The circuit 200 includes a cross-coupled latch device 202 (essentially an SRAM cell topology) operating in the second voltage domain, an inverter 204 operating in the first voltage domain, and a capacitor, C, that dynamically couples an inverted value of input data (Data_01) to a first (internal) node 206 of the latch device 202. A second (external) complementary node 208 of the latch device 202 represents the shifted output data (Data_12) for use in the second voltage domain. It will also be noted that relative device strengths for the NFET and PFET devices (as a factor of the on resistance, $R_{on}$) shown in FIG. 2 are exemplary only and are not to be construed in any limiting sense.

In operation, when the value of the input data (Data_01) transitions from logical 0 to logical 1 (i.e., from 0 V to 1.0 V), inverter 204 causes the lower electrode of the capacitor C to transition from a 1.0 V potential to ground (0 V) potential. Assuming the initial state of the output data (Data_12) is logical 0 (i.e., 1.0 V in the second voltage domain) at the time of transition, the internal node 206 is initially at the logical high state of 2.0 V. This means that initially the voltage across the capacitor C is 2.0 V−1.0 V=1.0 V. Since the capacitor voltage does not change instantaneously, the upper electrode is thus brought down toward 1.0 V in following the potential of the lower electrode. As a result, the external node 208 is then pulled up to the logical high of 2.0 V, which reinforces pulling of the internal node 206 down to 1.0 V.

On the other hand, if the initial state of the output data (Data_12) of the latch 202 were already at logical 1 (2.0 V) during the same transition of input data (Data_01) from 0 to 1, then there would be no net voltage across the capacitor initially. Therefore, as the lower electrode of the capacitor C is coupled to ground, the fact that the upper electrode of the capacitor would initially be pulled toward ground as well would not change the logical state of the latch 202. Rather, the PFET having its gate coupled to the internal node 206 would be turned even more strongly, and the latch 202 will reinforce maintaining 1.0 V on the internal node 206, thereby charging the capacitor C up to 1.0 V.

Conversely, when the input data (Data_01) transitions from 1 to 0 (and assuming the original state output data (Data_12) is at 2.0 V), the lower electrode of capacitor C is switched from ground potential to 1.0 V. Again, since the 1.0 V net voltage across the capacitor C does not change instantaneously, the upper electrode of C coupled to internal node 206 attempts to "follow" the lower electrode from 1.0 V to 2.0 V. This in turn causes the transition of the voltage on the external node from 2.0 V to 1.0 V, thereby reinforcing the 2.0 V value on the internal node 206.

If the initial state of the output data (Data_12) of the latch 202 were already at logical 0 (1.0 V) during the same transition of input data (Data_01) from 1 to 0, then voltage across the capacitor C would initially be 2.0 V. Therefore, as the lower electrode of the capacitor C is coupled to 1.0 V, the fact that the upper electrode of the capacitor would initially attempt to rise toward 3.0 V would not change the logical state of the latch 202. Rather, the NFET having its gate coupled to the internal node 206 would be turned even more strongly, and the latch 202 will reinforce maintaining 2.0 V on the internal node 206, thereby discharging the capacitor voltage down to 1.0 V.

Figure 3:
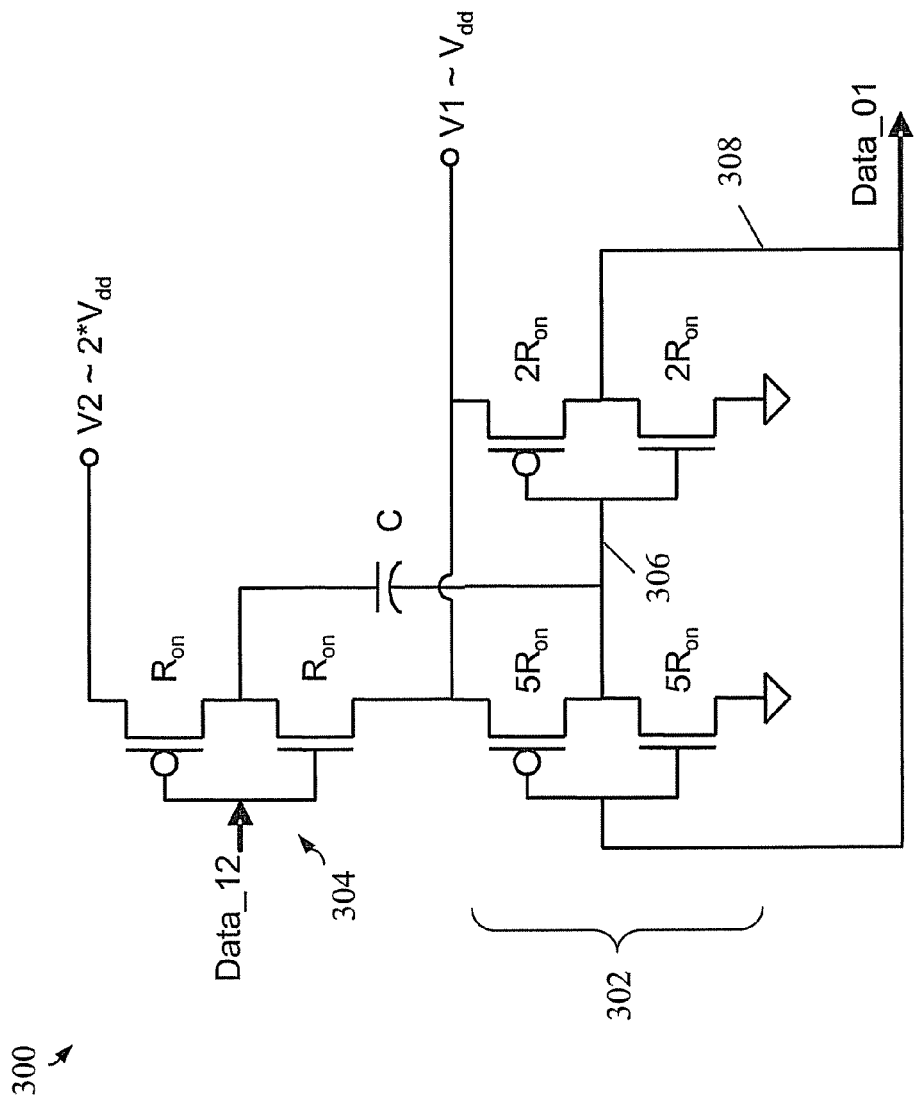
FIG. 3 is a schematic diagram of another exemplary voltage level shifter circuit that may be included within the data voltage level shifters of FIG. 1, in accordance with a further embodiment of the invention.

In addition to shifting data (and transitions in the logical value thereof) from a lower voltage domain to a higher voltage domain, the same can be accomplished from a higher voltage domain to a lower voltage domain. FIG. 3 is a schematic diagram of another exemplary voltage level shifter circuit 300 that may be included within the data voltage level shifters 106 of FIG. 1, in accordance with a further embodiment of the invention. In the example depicted, the circuit 200 converts a data transition from a higher voltage domain to a lower voltage domain. Even more specifically, circuit 300 converts input data from the second voltage domain (2*$V_{dd}$ to $V_{dd}$) to output data for use in the first voltage domain ($V_{dd}$ to ground).

The circuit 300 includes a cross-coupled latch device 302 (essentially an SRAM cell topology) operating in the first voltage domain, an inverter 304 operating in the second voltage domain, and a capacitor, C, that dynamically couples an inverted value of input data (Data_12) to a first (internal) node 306 of the latch device 302. A second (external) node 308 of the latch device 302 represents the shifted output data (Data_01) for use in the first voltage domain. Again, it will also be noted that relative device strengths for the NFET and PFET devices (as a factor of the on resistance, $R_{on}$) shown in FIG. 3 are exemplary only and are not to be construed in any limiting sense.

As the operation of circuit 300 is substantially similar to that of circuit 200, a detailed explanation of the same is omitted. However, in summary, a transition in the input data (Data_12) from logical 0 to logical 1 in the second voltage domain (1.0 V to 2.0 V) results in a corresponding change in the output data (Data_01) from logic 0 to logical 1 in the first voltage domain (0 V to 1.0 V). Conversely, a transition in the input data (Data_12) from logical 1 to logical 0 in the second voltage domain (2.0 V to 1.0 V) results in a corresponding change in the output data (Data_01) from logic 1 to logical 0 in the first voltage domain (1.0 V to 0 V).

In addition to facilitating communication between integrated circuits within stacked voltage domains, such voltage level shifting circuits 200, 300 also allow for synchronized clocks operating at different voltages levels, which in turn are used for switched capacitor voltage converters. Such voltage converters (e.g., converter 104 in FIG. 1) may also be used advantageously to implement one or more modes of power regulation with respect to differing loads among the multiple ICs residing in different voltage domains.

Figure 4:
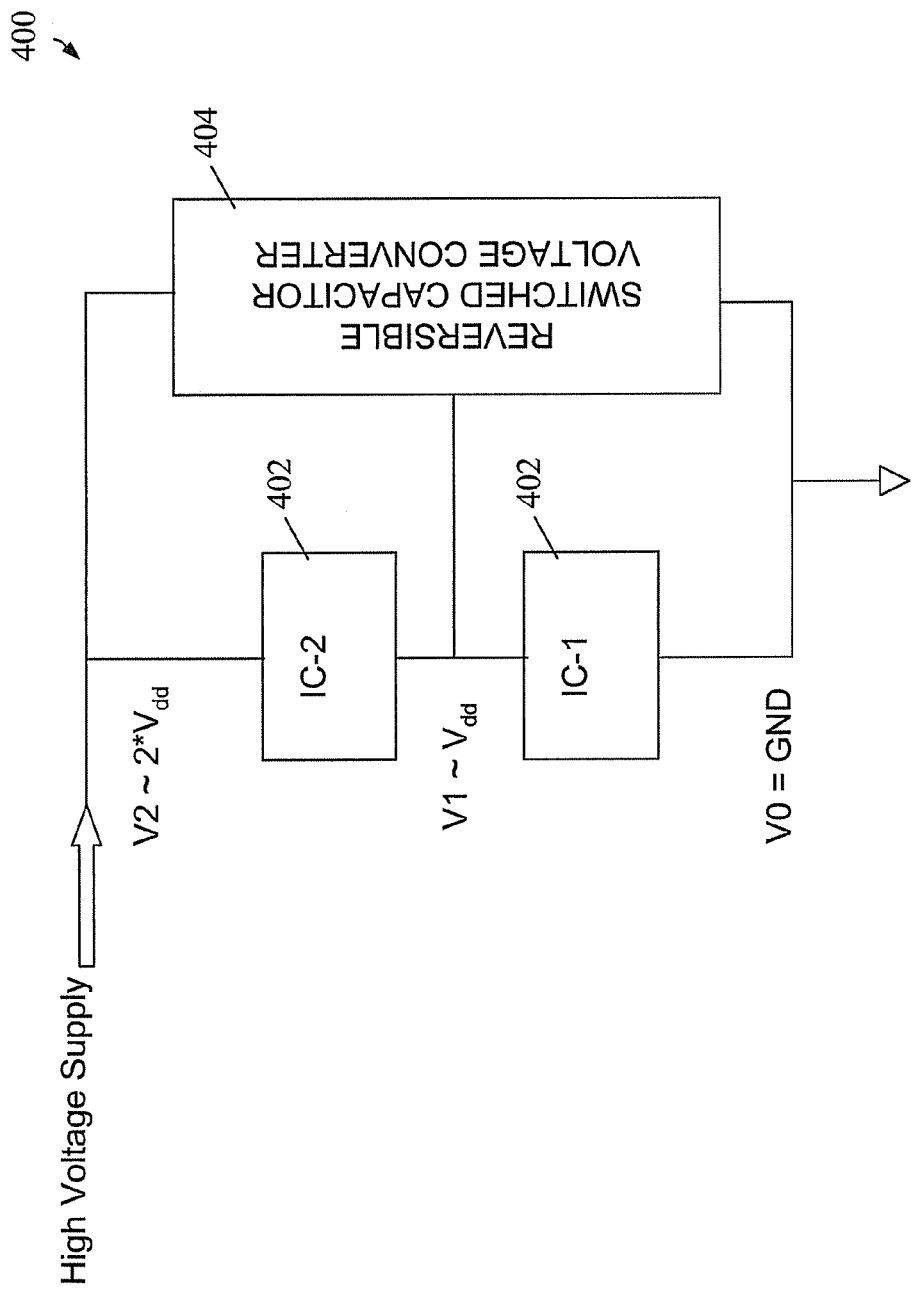
FIG. 4 is a schematic diagram of a two-domain example of a stacked IC system, with a corresponding 2:1 switched capacitor voltage converter.

By way of illustration, FIG. 4 is a schematic diagram of a two-domain example of a stacked IC system 400, with a corresponding 2:1 switched capacitor voltage converter 404. In a practical system, it is quite conceivable that IC-1 and IC-2 may have different loads due to variations in, for example, transistor device threshold voltage ($V_t$) variation or activity variation. In this case, the reversible voltage converter 404 may be used in a manner that adapts to the needs of IC-1 and IC-2. Specifically, several modes of power regulation may be realized by changing the converter clock frequency (i.e., the rate in which the converter switch signals $\phi_1$ and $\phi_2$ alternately open and close the converter switches). For example, to provide substantially the same current value through both IC-1 and IC-2, the converter frequency is set to 0 (i.e., essentially deactivated) to prevent current from being shunted from either of the serially connected ICs. At the other extreme, to establish a substantially identical operating voltage across both IC-1 and IC-2, the clock frequency of the converter should approach infinity. Still another possible mode of operation is to balance the power usage of IC-1 and IC-2 by setting the clock frequency to some intermediate value. More generally, for any desired current and voltage relationship, the current is proportional to $V^{1.5}$ for IC-1 and IC-2 loads.

FIG. 5 is a table that illustrates an example of implementing constant power operation with respect to the first and second integrated circuits IC-1 and IC-2 of FIG. 4. In this example, R1>R2, wherein R1 is the load resistance for IC-1 (e.g., 1Ω), R2 is the load resistance for IC-2 (e.g., 0.8 S2), and the operating voltage of the external supply, V2=1.8 V.

Without the use of a regulator, the resulting voltage across IC-1 is V1=1.0 V (with the same current of 1.0 A running through both IC-1 and IC-2); therefore, the power dissipated by IC-2 is P2=0.8 W, and the power dissipated by P1=1.0 W (since P=I²R and I1=I2=1.0 A). This represents a 20% difference in the power dissipated by IC-1 and IC-2. In contrast, through the use of the reversible voltage converter, the voltage across IC-1 may be downwardly adjusted to V1=0.95 V, and the voltage across IC-2 is thus upwardly adjusted to Vdd2=V2−V1=0.85 V. As a result, IC-1 and IC-2 no longer pass the same magnitude of current (the current through IC-2 increases from 1.0 A to 1.0625 A, while the current through IC-1 decreases from 1.0 A to 0.95 A), and thus P2=P1=0.903 W.

FIG. 6 is another table that represents a comparison between the power dissipation difference with no voltage regulation, and the balancing of power dissipation through voltage regulation. In this example, the same parameter values only this time with R1<R2, R1=0.8Ω and R2=1.0Ω. In sum, without voltage regulation, IC-2 dissipates 1.0 W, while IC-1 dissipates 0.8 W, thus representing a 20% power difference. Through the use of a reversible voltage converter, the voltage across IC-1 may be upwardly adjusted to V1=0.85 V, and the voltage across IC-2 is thus downwardly adjusted to Vdd2=V2−V1=0.95 V. As a result, IC-1 and IC-2 no longer pass the same magnitude of current (the current through IC-2 decreases from 1.0 A to 0.95 A, while the current through IC-1 increases from 1.0 A to 1.0625 A), and thus P2=P1=0.903 W.

Figure 7:
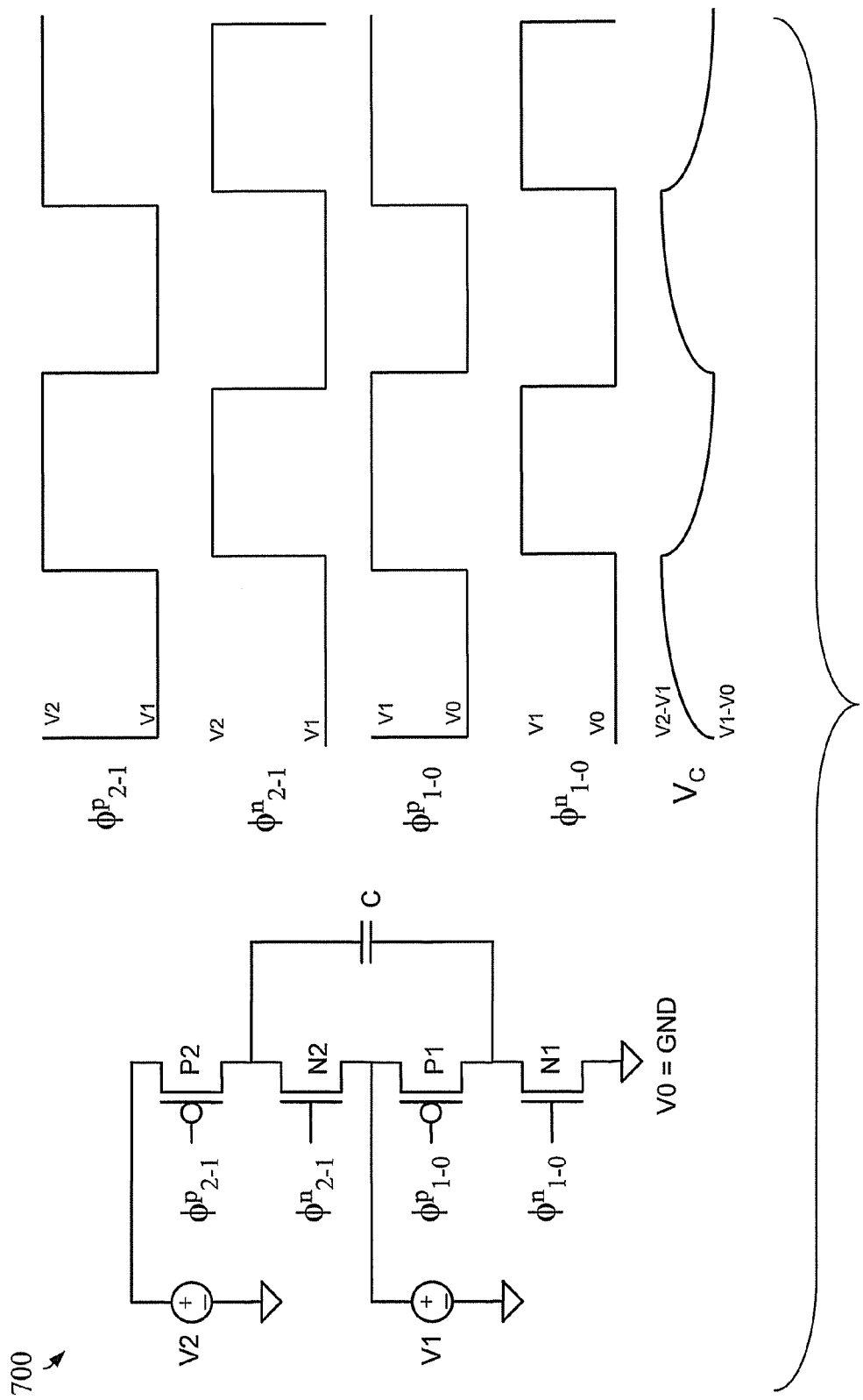
FIG. 7 is a schematic diagram of a single phase voltage conversion system using switched capacitor voltage converters.
Figure 8:
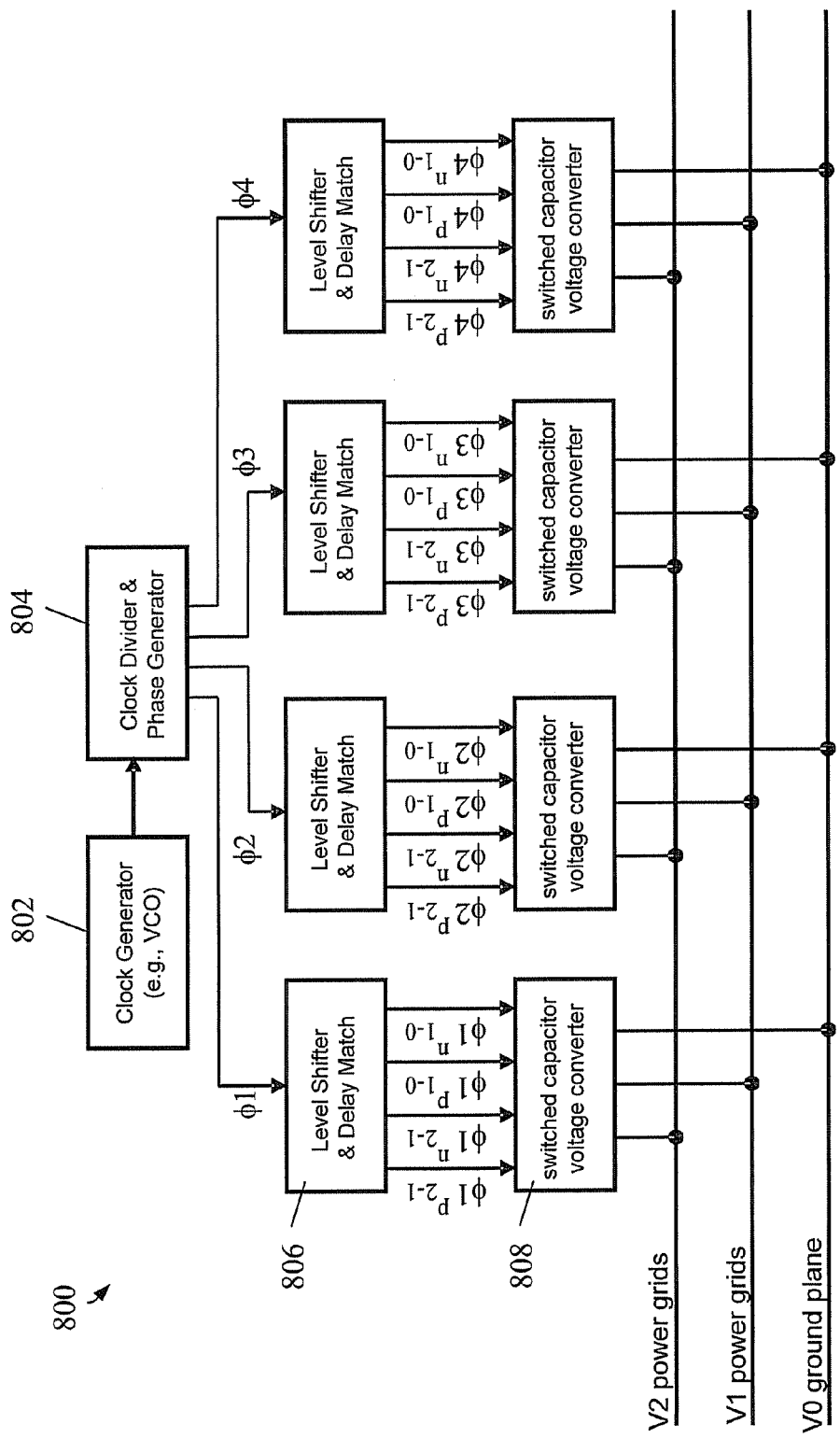
FIG. 8 is a schematic diagram of a multi-phase, three-domain example of a stacked IC system, with a corresponding 3:1 switched capacitor voltage converter.

A schematic diagram of an exemplary single-phase voltage switched capacitor voltage converter 700, together with an associated voltage and timing diagram, are shown in FIG. 7. Referring to FIG. 8, there is shown a schematic diagram of an exemplary, multi-phase voltage conversion system 800 using switched capacitor voltage converters. The system 800 is a three-node reversible voltage converter, has power grids for V2, V1, and V0 (e.g., ground plane), and is suitable for use with a multiple IC device system having stacked voltage domains. A clock generator 802 is implemented. A clock divider and clock phase generator 804 receives an input clock signal from the clock generator 802, and generates output clock signals with multiple phases. In the exemplary embodiment depicted, four phases are generated in FIG. 8, which are designated as $\phi 1$, $\phi 2$, $\phi 3$, and $\phi 4$.

Assuming these original clock signals from the clock generator and clock dividers swing between V1 and ground, then level shifters 806 (e.g., as shown in FIG. 1-3) are used to generate clock signals operating between V1 and V2, together with matching delays for the original clock signals operating between the ground plane and V1. These regenerated clock signals (for example, the signals $\phi_{2\text{-}1}^{p}$, $\phi_{2\text{-}1}^{n}$, $\phi_{1\text{-}0}^{p}$, $\phi_{1\text{-}0}^{n}$, for phase $\phi 1$) are then coupled to the voltage converters 808, such as illustrated in FIG. 7 described above. Again, this exemplary system 800 may be extended for 3-to-1 voltage conversion, or more generally, M-to-N voltage conversions where the power grids for intermediate voltage levels can be used. It is also extendable to as many clock phases as needed. Additional information describing the operation and topology of voltage converter circuit topologies may be found in co-pending application Ser. No. 12/392,476, filed Feb. 25, 2009, the contents of which are incorporated herein in their entirety.

The switched capacitor voltage converter shown in FIG. 8 is implemented with a more traditional control scheme that includes clock generation, clock divider and phase generation, level shift and delay match. For improved conversion efficiency, the power consumption overhead for operating the control circuits may be minimized as discussed below through novel topologies and methods that significantly reduce or eliminate the overhead of control circuits.

Figures 9A, 9B:
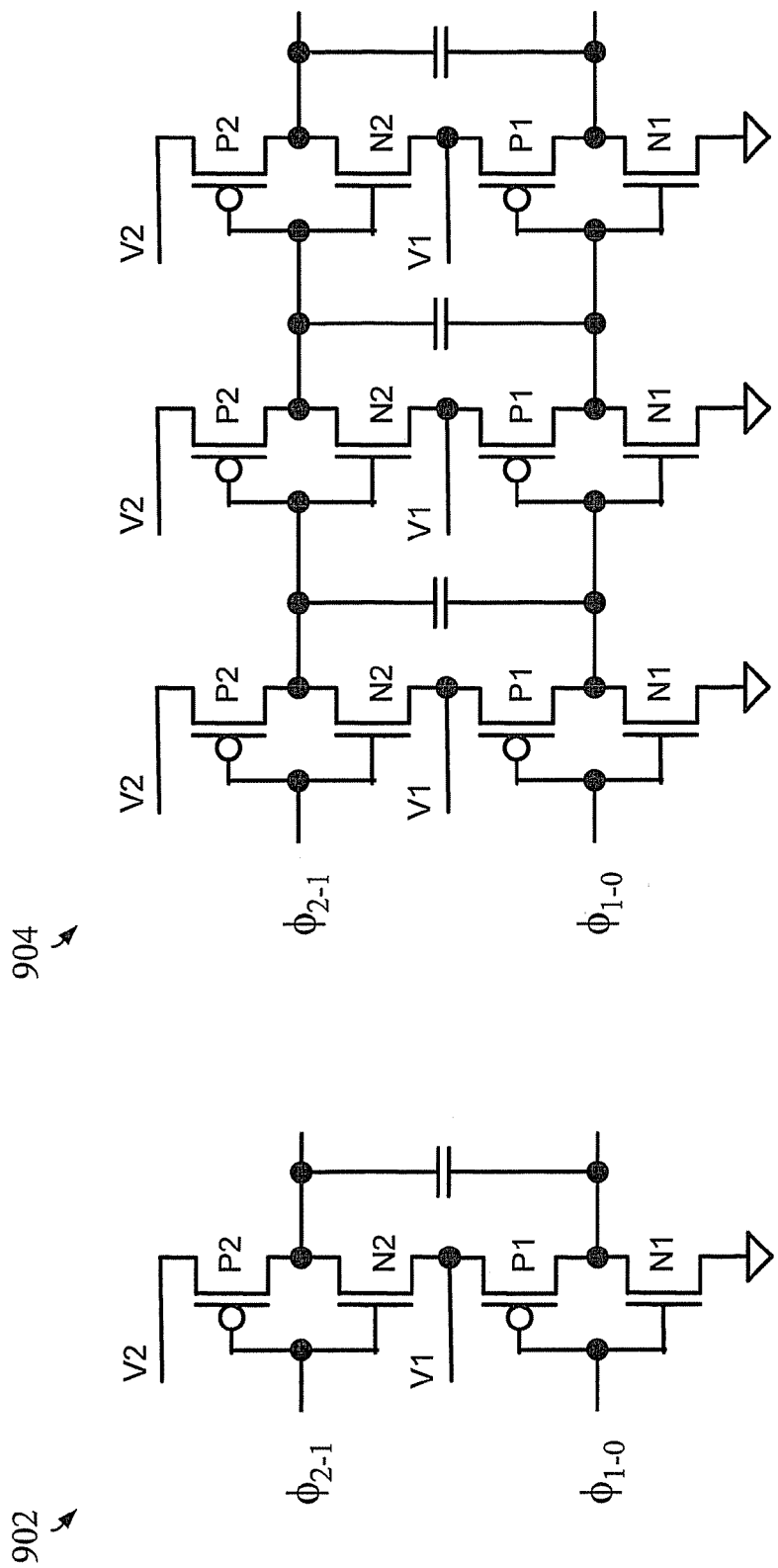
FIG. 9(a) is a schematic diagram of a voltage converter unit.
FIG. 9(b) is a schematic diagram of a chain of switched capacitor voltage converter units as shown in FIG. 9(a), in accordance with a further embodiment of the invention.

Based on the converter topology shown in FIG. 7, a modified version is shown in FIG. 9(a). In the capacitor voltage converter 902 of FIG. 9(a), the lower inverter including P1 and N1 operates in the first voltage domain between V0 and V1, while the upper inverter including P2 and N2 operates in the second voltage domain between V1 and V2. The voltage converter 902 represents a basic block or unit cell for a multiphase system operating on stacked voltage domains. As opposed using non-overlapping actuating signals for P2 and N2 as shown in FIG. 7, a common actuating signal is applied to both P2 and N2 in the embodiment of FIG. 9(a). Here, the transistor threshold voltages of P2 and N2 may be advantageously chosen to be larger than one-half of the voltage drop across the voltage domain, so that P2 and N2 will not be turned on at the same time. A similar technique is applied to P1 and N1.

By way of comparison, FIG. 9(b) illustrates an open-ended chain of unit cells 904, where each unit cell drives the next unit cell. Instead of having separate actuating signals for each unit cell, the actuating signals are only used for the first cell. As such, the control scheme shown in FIG. 8 is simpler in comparison to traditional control schemes, resulting in significant power savings.

Figure 10:
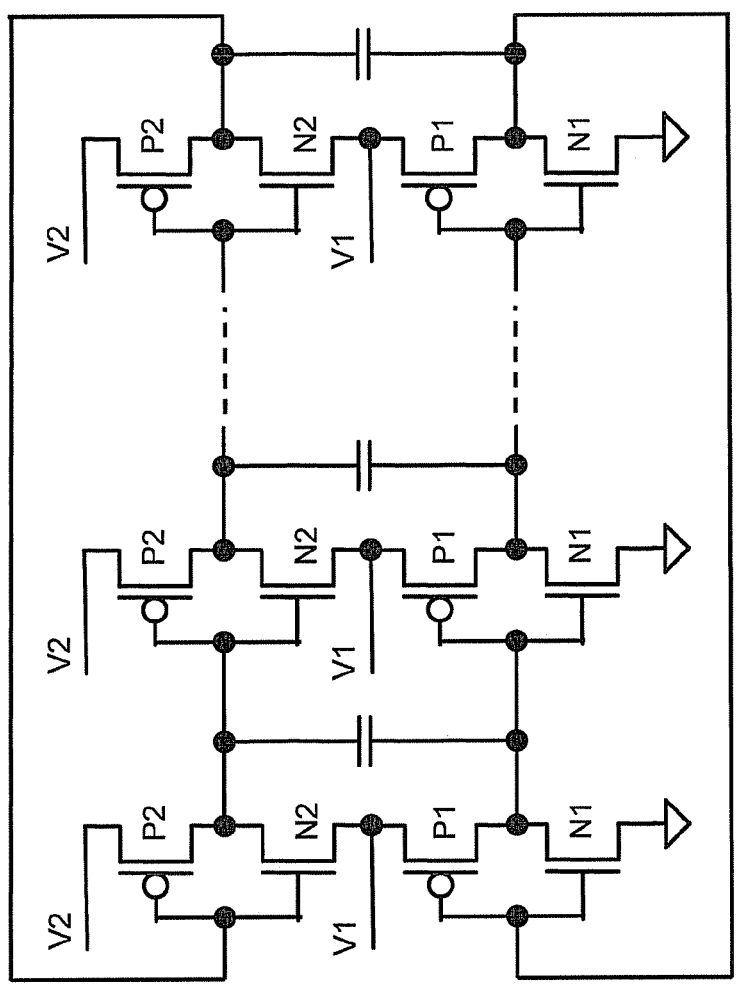
FIG. 10 is a schematic diagram of a 3-node reversible, switched capacitor voltage converter.
Figure 11:
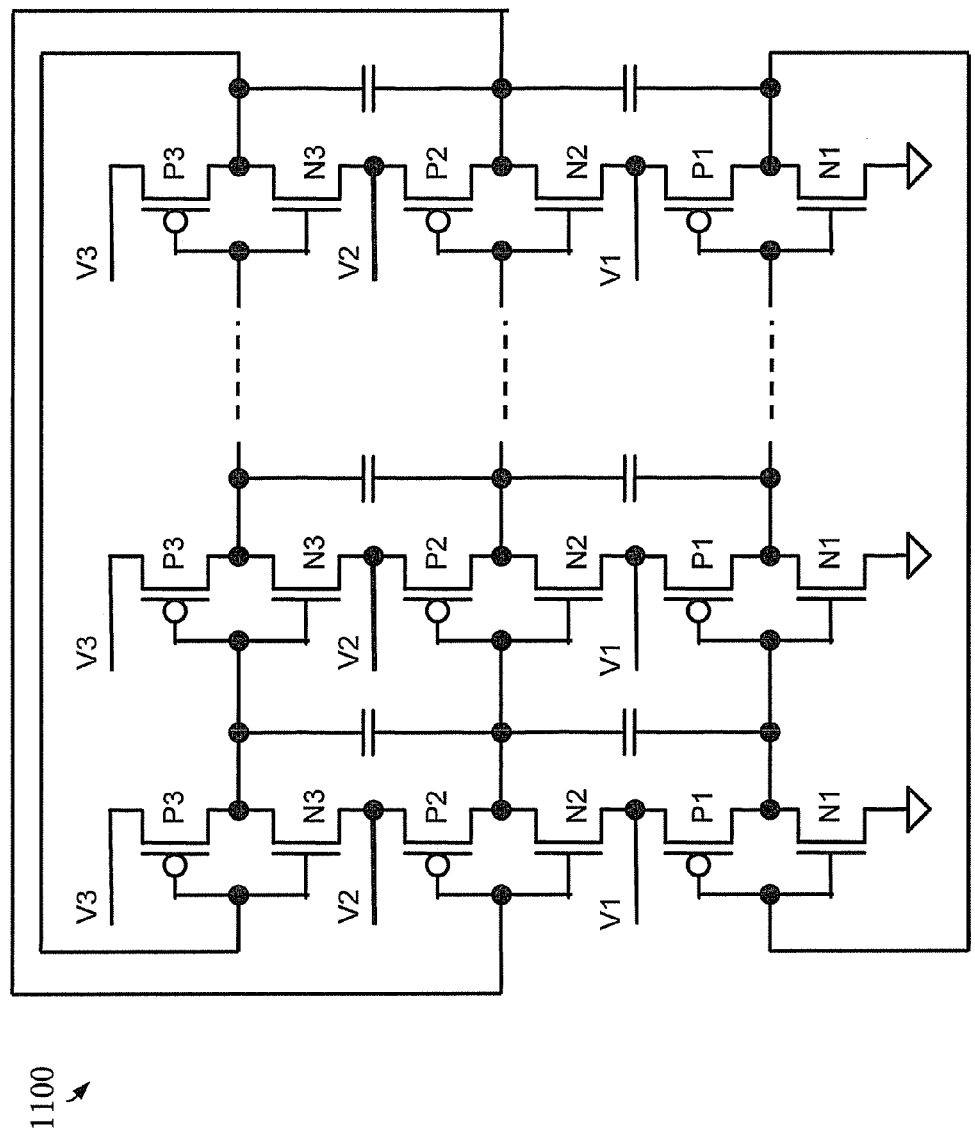
FIG. 11 is a schematic diagram of a 4-node reversible switched capacitor voltage converter.

Ring oscillators can be formed with any odd number of inverting stages. As shown in FIG. 10, an exemplary ring oscillator structure 1000 is formed with 3-node converter units, where each unit cell drives the next unit cell. This forms a 3-node (V2, V1, and GND) reversible voltage converter system. A 4-node (V3, V2, V1, and GND) reversible voltage converter system 1100 is shown in FIG. 11, which includes ring oscillator structures having an odd number of 4-node voltage converter units, with each unit drives the next unit. By integrating a ring oscillator structure with the unit cells of voltage converter itself, a complete voltage converter system is formed by the voltage conversion unit cells, without any layout and power overhead for additional control circuits.

Figure 12A:
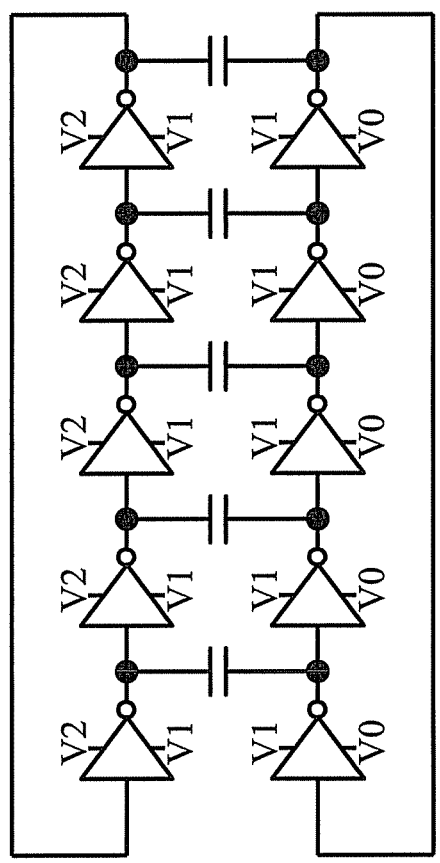
FIGS. 12(a) through 12(c) are schematic diagrams of exemplary reversible switched capacitor voltage converter systems, respectively having 3, 4, and 5 nodes.
Figure 12B:
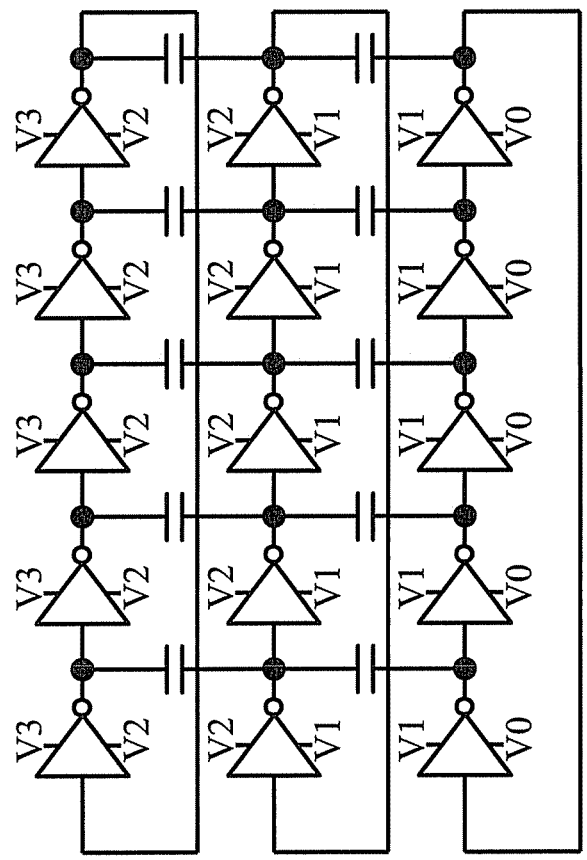
Figure 12C:
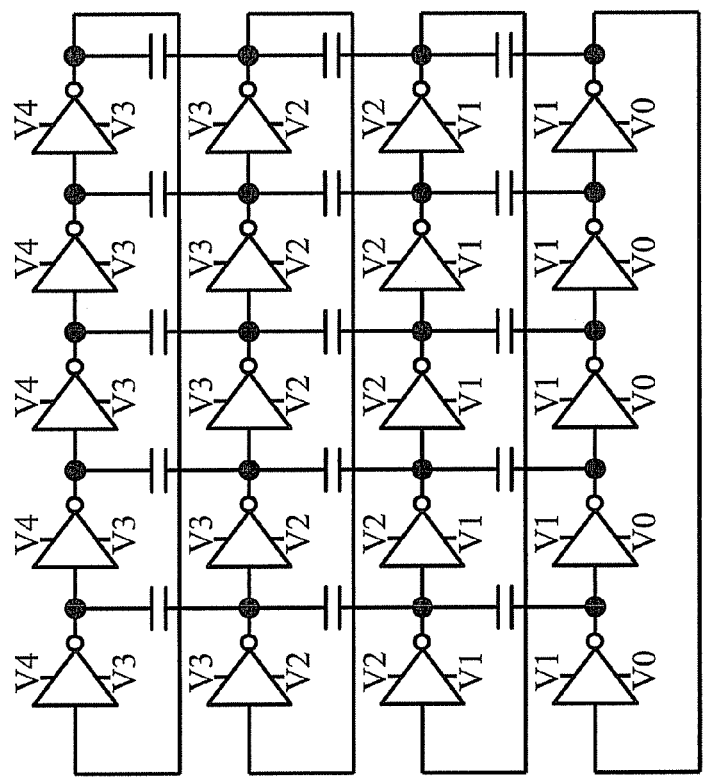

Referring generally to FIGS. 12(a) through 12(c), it will be seen that the voltage converters disclosed above include circuit blocks operating on stacked voltage domains. For example, FIG. 12(a) depicts a 3-node system 1200 which can be viewed as two ring oscillators operating on two voltage domains, V0 to V1, and V1 to V2, respectively. FIG. 12(b) illustrates a 4-node system 1220 which can be viewed as three ring oscillators operating on three voltage domains, V0 to V1, V1 to V2, and V2 to V3, respectively. FIG. 12(c) illustrates a 5-node system 1240 which can be viewed as three ring oscillators operating on four voltage domains, V0 to V1, V1 to V2, V2 to V3, and V3 to V4, respectively. A reversible switched capacitor voltage converter with N+1 nodes can be built on N stacked voltage domains.

Figure 13:
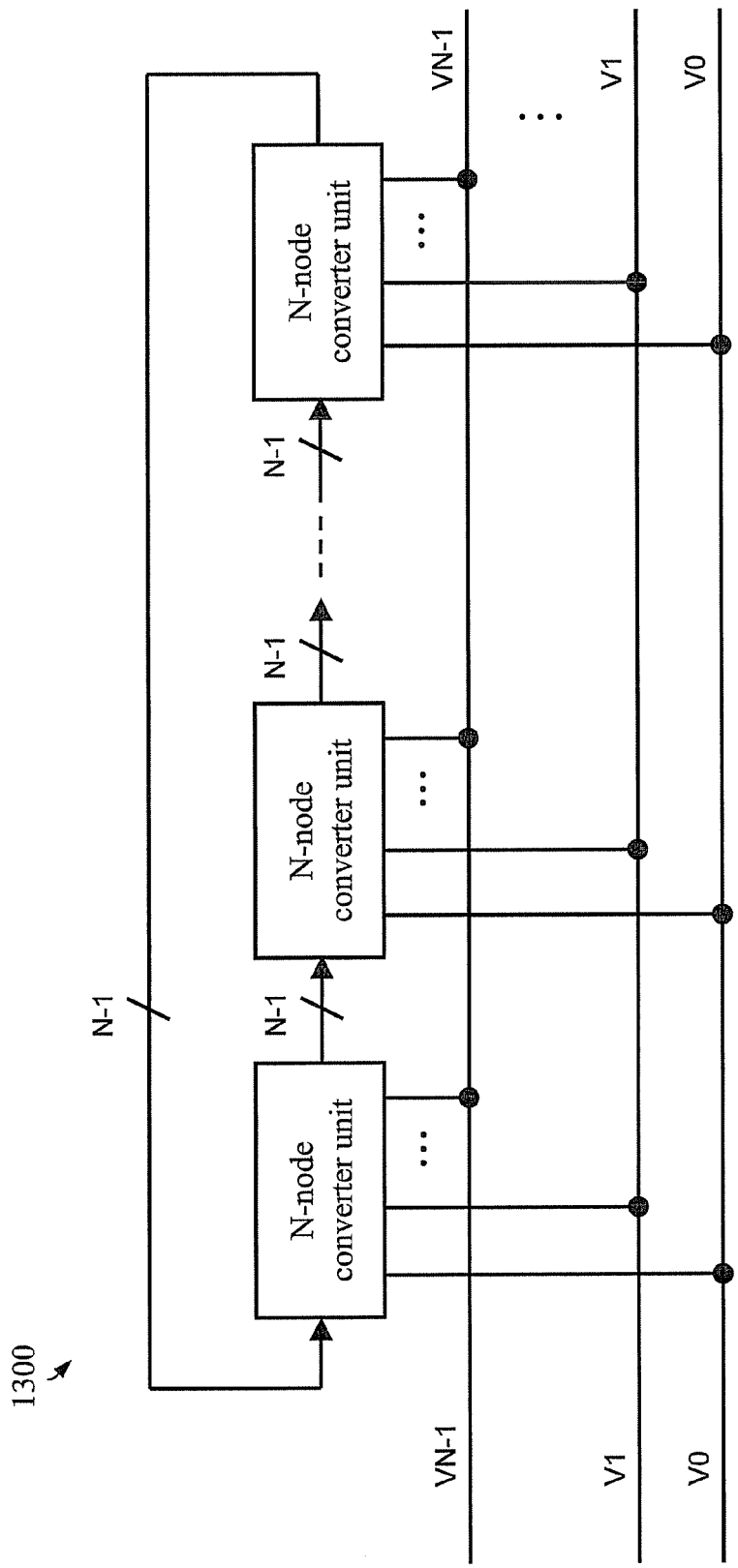
FIG. 13 is a schematic diagram of a system of reversible switched capacitor voltage converters.
Figure 14:
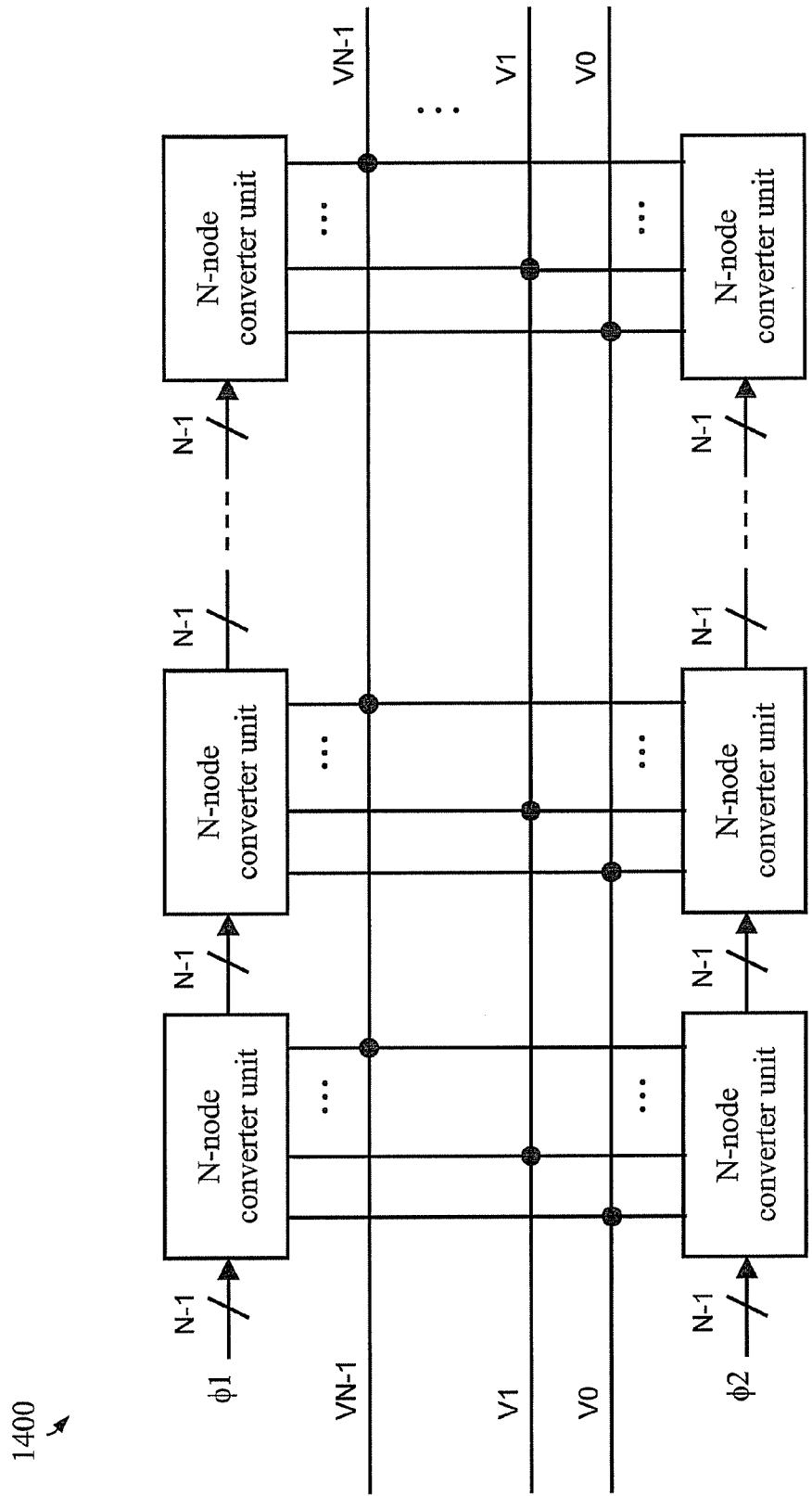
FIG. 14 is a schematic diagram of another system of reversible switched capacitor voltage converters.

In general, the disclosed methodology uses the voltage converter to operate on stacked voltage domains, and to generate input/output signals in such a way that one cell drives another cell, either in a ring oscillator structure, or in open-ended chain structures. An exemplary ring structure 1300 is shown in FIG. 13, in which no additional circuits are needed in order for the voltage converter to function, assuming the system has an odd number of inversion stages. An open ended chain structure 1400 is shown in FIG. 14, where φ1 and φ2 are initial inputs for two exemplary open chains. In general, one or more initial input actuating signals can be generated by a traditional control scheme such as shown in FIG. 8.

Figure 15A:
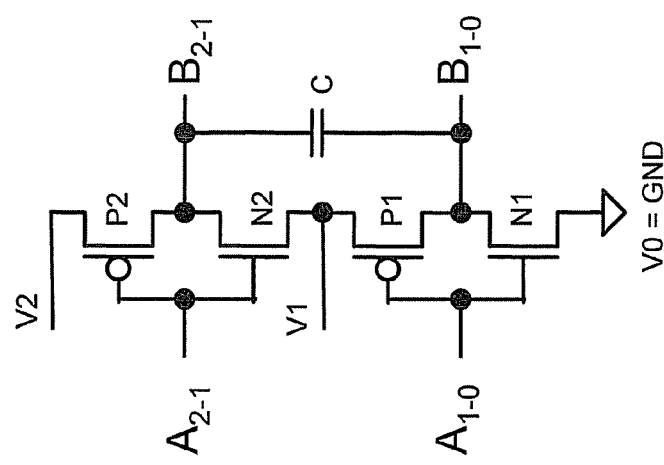
FIGS. 15(a) through 15(d) are schematic diagrams of exemplary voltage converter units that can be incorporated to the systems shown in FIG. 13 and FIG. 14.

For both the ring structure 1300 shown in FIG. 13 and the open chain structure 1400 shown in FIG. 14, various voltage converter units may be constructed for tradeoffs and design efficiency. FIGS. 15(a) through 15(d) illustrate some examples of such of 3-node converters. It will be appreciated, however, that an n-node unit cell can also be constructed. For example, FIG. 15(a) is the simplest version of the converter 1500 which was also shown in FIG. 9(a) earlier. Variations on this design are presented in FIGS. 15(b) through 15(d), as well as in FIG. 16.

Figure 15B:
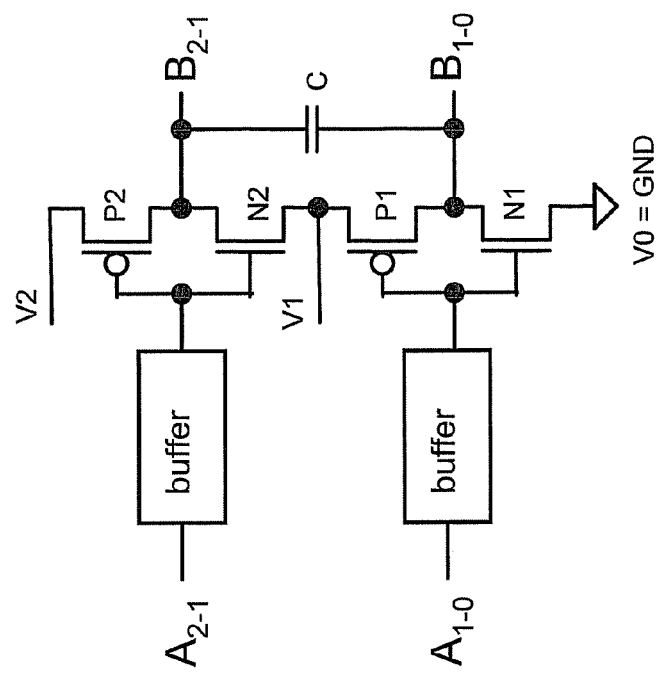

As particularly shown in FIG. 15(b), the clock frequency of the ring oscillator 1520 can be controlled by inserting a delay element (buffer). The amount of delay time can be fixed in design or changed in operation, for example, by using an additional bias voltage. More generally, a ring oscillator can be formed with any odd number of inverting stages, which include any number of voltage converter unit cells and any number of other buffers or inverter. The technique for controlling the clock frequency is similar to those used in voltage control oscillator (VCO) circuit and understood by those skilled in the art of VCO designs.

Figure 15C:
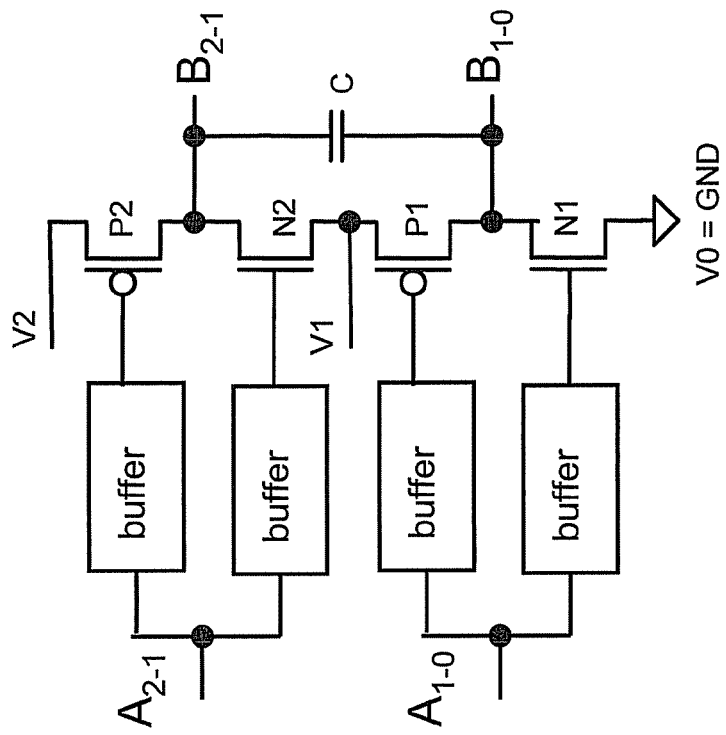
Figure 15D:
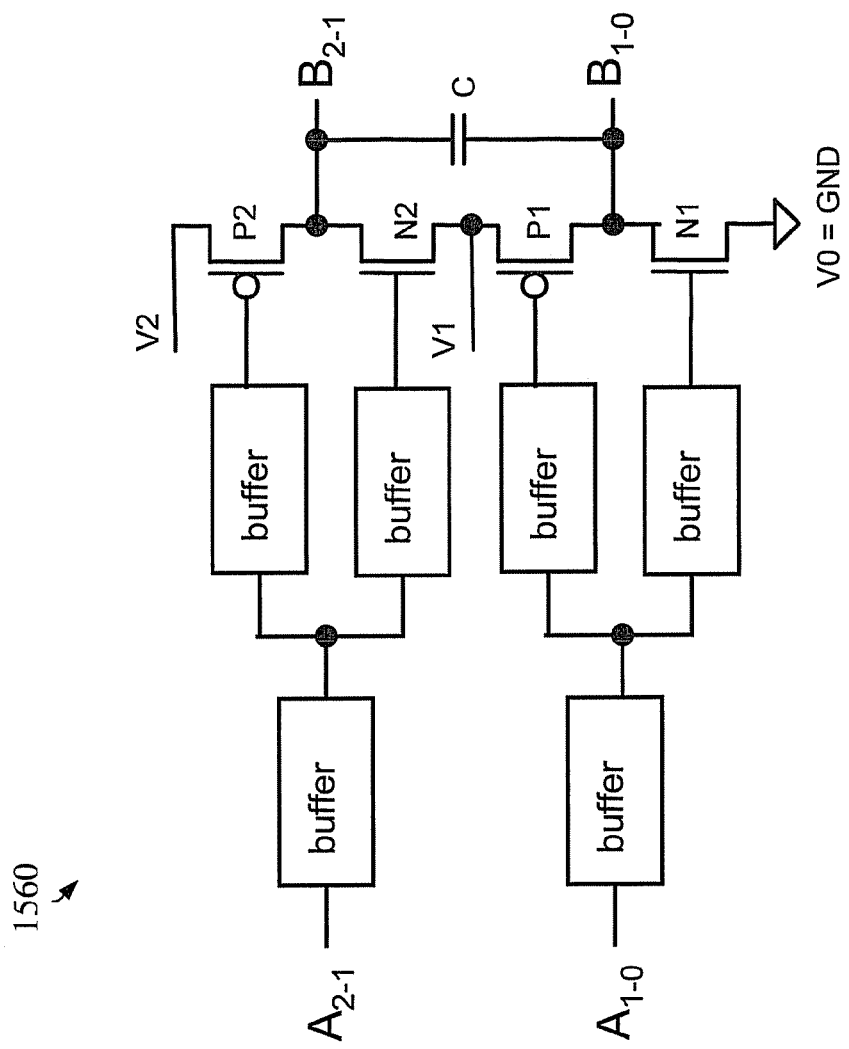
Figure 16:
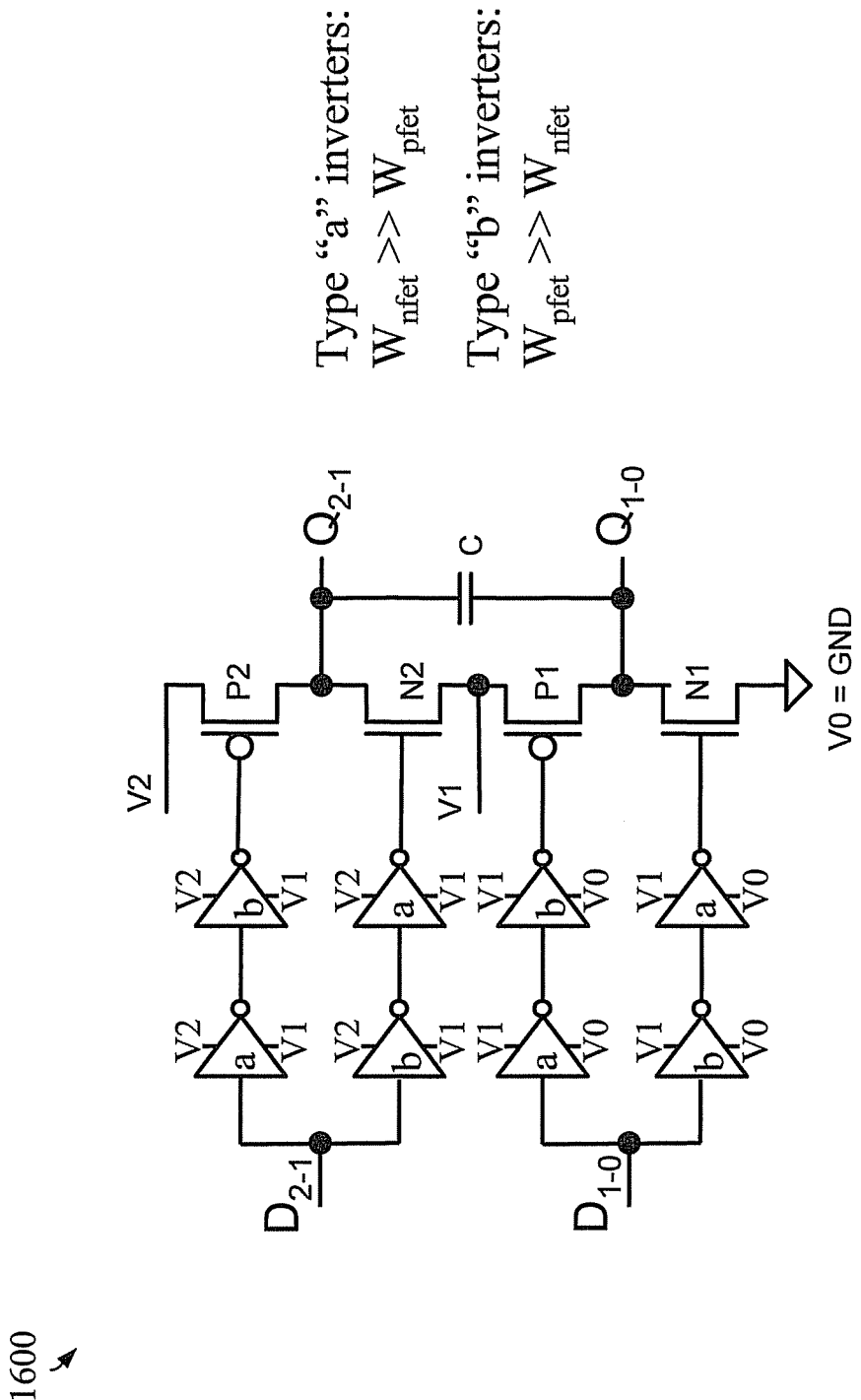
FIG. 16 is a schematic diagram of a voltage converter unit with exemplary generation of non-overlapping actuating signals.

Again, separate actuating signals may be generated for each of the switching devices of the converters 1540, 1560 shown in FIG. 15(c) and FIG. 15(d), respectively. One purpose for this topology is to generate non-overlapping signals. In the above description with reference to FIG. 9(a), a threshold voltage control method is used so that the PFET and NFET in each pair are not simultaneously conducting. Still another alternative embodiment of a voltage converter unit 1600 with non-overlapping actuating signals is shown in FIG. 16. By varying the NFET/PFET device width ratios, the rising and falling transition times are skewed and, as a result, non-overlap actuating signals can be generated and applied to each FET.

Figure 17:
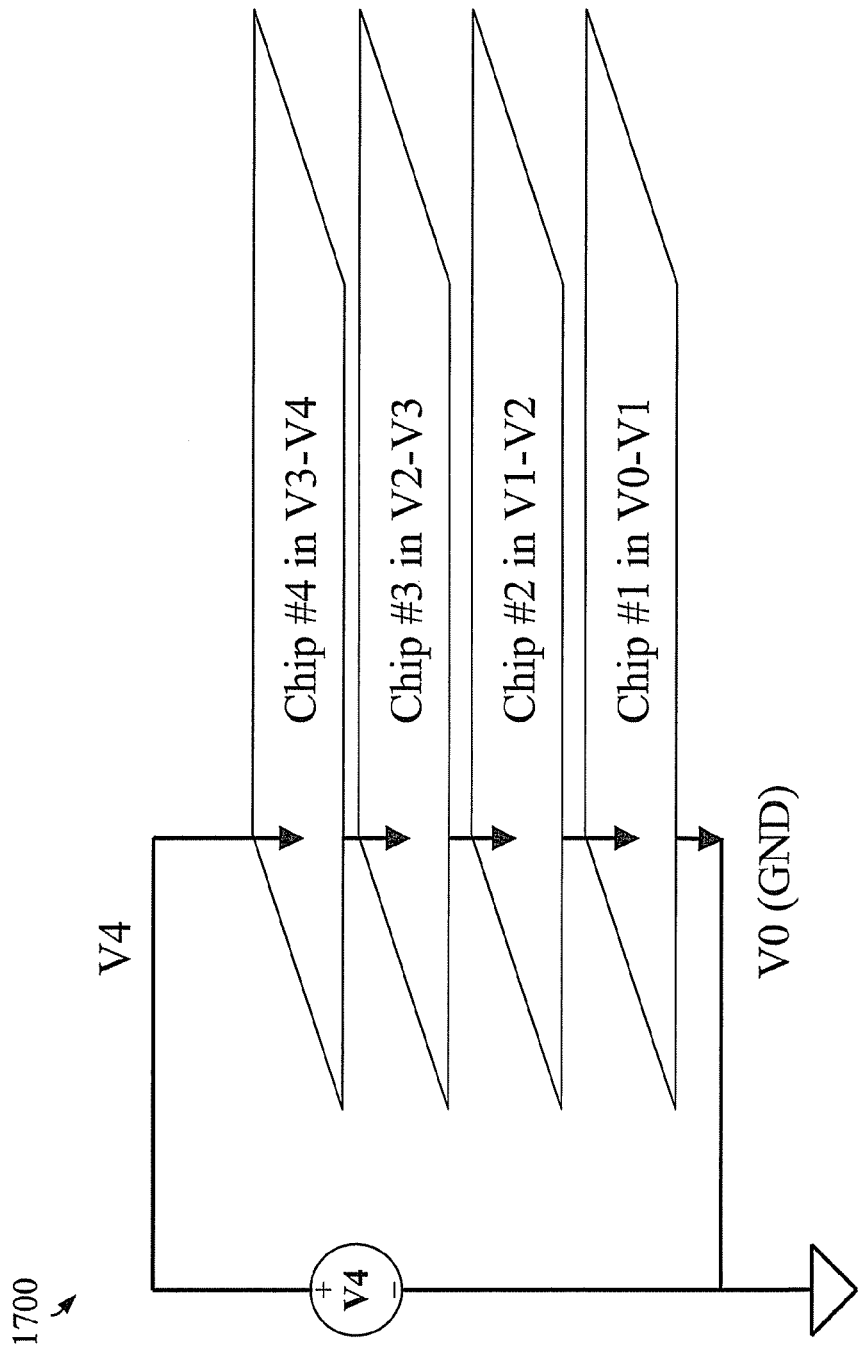
FIG. 17 is a schematic diagram representing ICs operating on stacked voltage domains also being physically stacked vertically.

It will thus be appreciated that the integrated circuits embodiments described herein may be interpreted as any circuit blocks, microprocessor cores and any other logic or physical circuit units. They can be on the same physical chip or different chips. When implemented on the same chip, using Silicon-On-Insulator (SOI) technology is particularly advantageous, or alternatively, using triple-well bulk technology is possible. When implemented on different chips, voltage domains can be stacked physically. To this end, FIG. 17 shows a configuration of chips 1700 on stacked voltage domains that are also physically vertically stacked, which can be a preferred power delivery method for 3D integrated circuit technology.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A reversible, switched capacitor voltage conversion apparatus, comprising:

a plurality of individual unit cells coupled to one another in stages, with each unit cell comprising multiple sets of inverter devices arranged in a stacked configuration, such that each set of inverter devices operates in separate voltage domains wherein for each inverter device in each of the plurality of unit cells, outputs of each of the inverter devices in adjacent voltage domains are capacitively coupled to one another such that a first terminal of a capacitor is coupled to an output of a first inverter device in a first voltage domain, and a second terminal of the capacitor is coupled to an output of a second inverter in a second voltage domain;

wherein, for both the first and second voltage domains, a first of the plurality of individual unit cells serve as corresponding inputs for a second of the plurality of individual unit cells, and for both the first and second voltage domains, outputs of the second of the plurality of individual unit cells serve as corresponding inputs for a third of the plurality of individual unit cells; and for both the first and second voltage domains, outputs of a last of the plurality of individual unit cells comprise inputs to a first of the plurality of individual unit cells in a ring oscillator type structure.

2. The apparatus of claim 1, wherein inputs to the first of the plurality of individual unit cells comprise control signals.

3. The apparatus of claim 1, wherein the inputs to the first of the plurality of individual unit cells are prevented from allowing simultaneous conduction of a PFET device and an NFET device of inverter device in each voltage domain.

4. The apparatus of claim 3, wherein each input to the first of the plurality of individual unit cells is coupled to a buffer device operating in the corresponding voltage domain, with an output of each buffer device serving as inputs to the inverter device in the corresponding voltage domain.

5. The apparatus of claim 4, further comprising, for each voltage domain, a first buffer device coupled to a PFET of the inverter device and a second buffer device coupled to an NFET of the inverter device.

6. The apparatus of claim 4, wherein the first and second buffer devices each comprise an inverter pair where a first of the inverter pair has a larger NFET/PFET device width ratio and a second of the inverter pair has a larger PFET/NFET device width ratio.

* * * * *